United States Patent [19]
Bartlett

[11] 4,247,915
[45] Jan. 27, 1981

[54] PUNCH-THROUGH LOAD DEVICES IN HIGH DENSITY STATIC MEMORY CELL

[75] Inventor: Keith G. Bartlett, Houston, Tex.

[73] Assignee: Texas Instruments Incorporated, Dallas, Tex.

[21] Appl. No.: 622

[22] Filed: Jan. 2, 1979

[51] Int. Cl.³ .............................................. G11C 11/40
[52] U.S. Cl. ................................... 365/154; 307/279; 357/13
[58] Field of Search ................... 365/154; 357/13, 23; 307/279

[56] References Cited
U.S. PATENT DOCUMENTS
4,158,239  6/1979  Bertin ................................. 365/154

OTHER PUBLICATIONS
Baitinger et al., Self-Restoring Six-Device FET Memory Cell, IBM Tech. Discl. Bul., vol. 14, No. 4, 9/71, pp. 1340-1341.

*Primary Examiner*—Stuart N. Hecker
*Attorney, Agent, or Firm*—John G. Graham

[57] ABSTRACT

A semiconductor memory of the static type employs a pair of cross-coupled driver transistors and a pair of access transistors along with load devices which are punch-through elements resembling short channel MOS transistors without gates. The punch-through elements each have an electrode integral with the drain of one of the driver transistors, and another electrode coupled to a voltage supply. A cell layout of very small size is possible.

10 Claims, 11 Drawing Figures

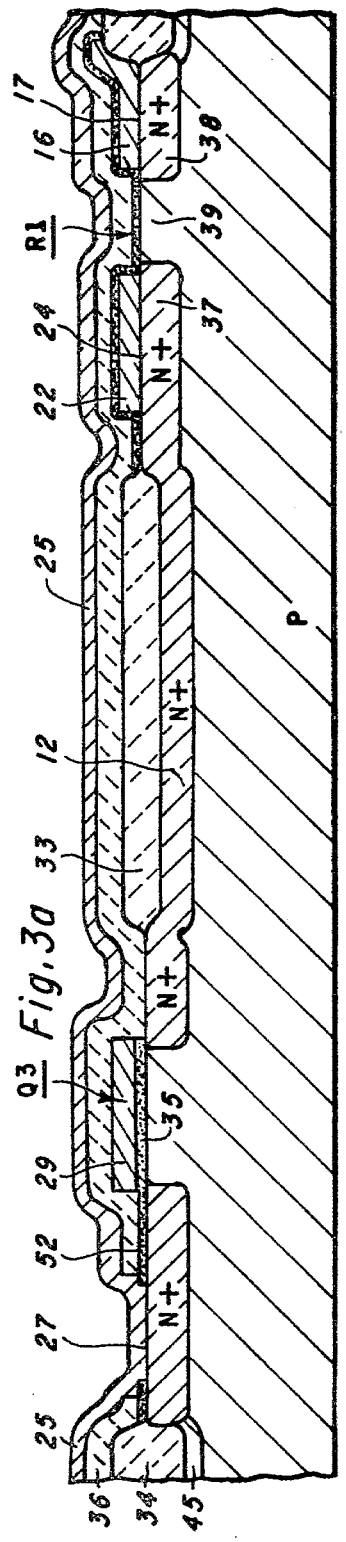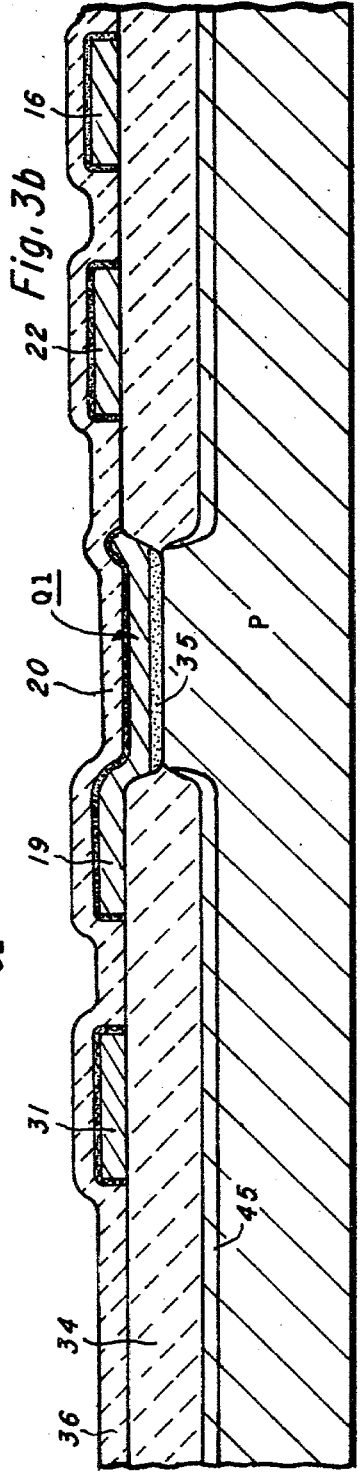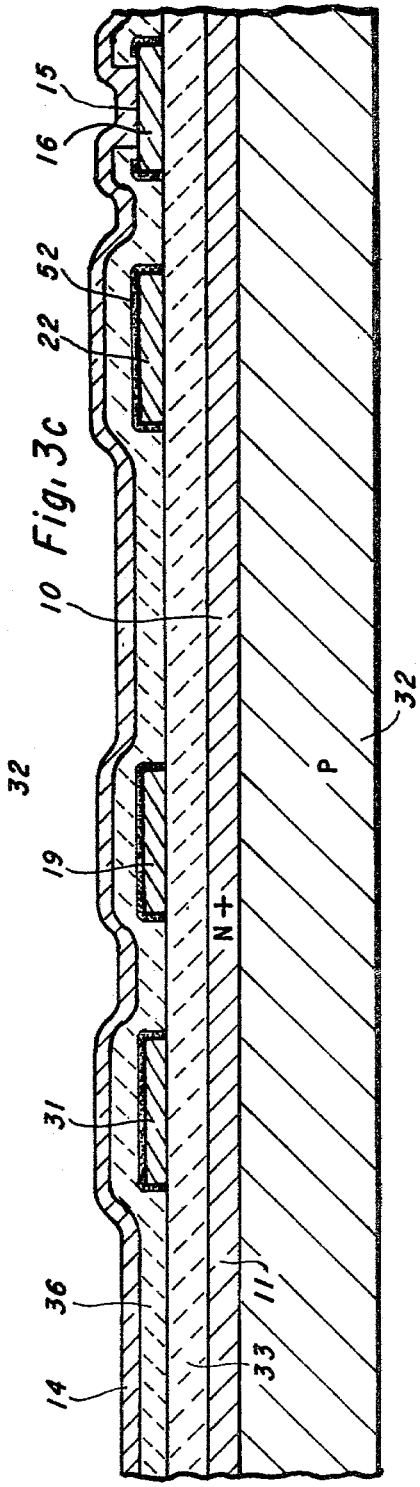

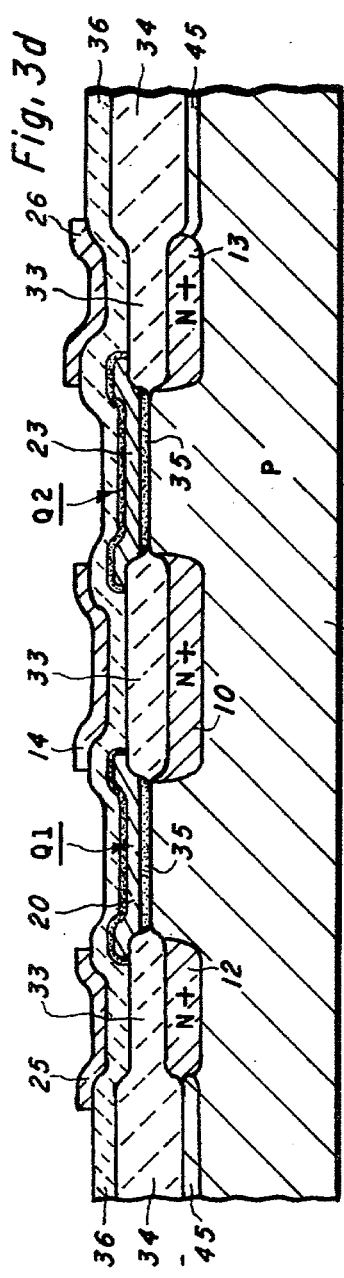
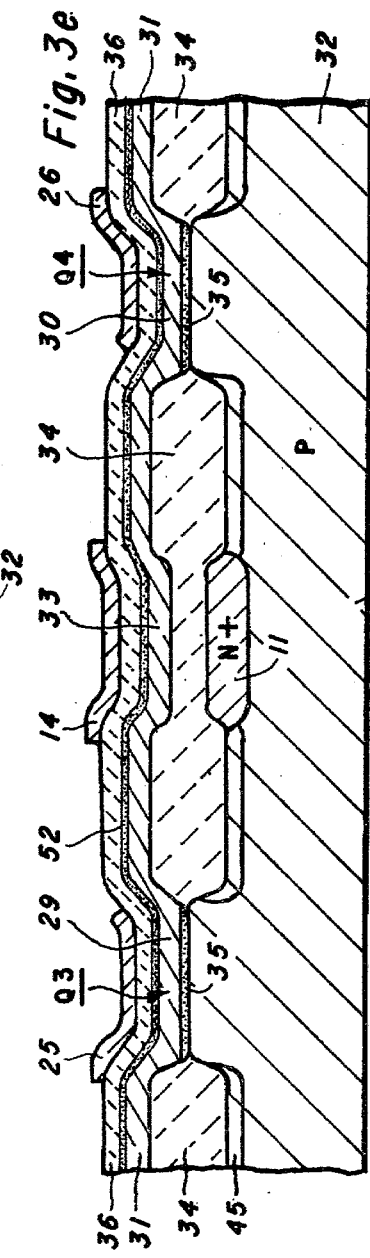
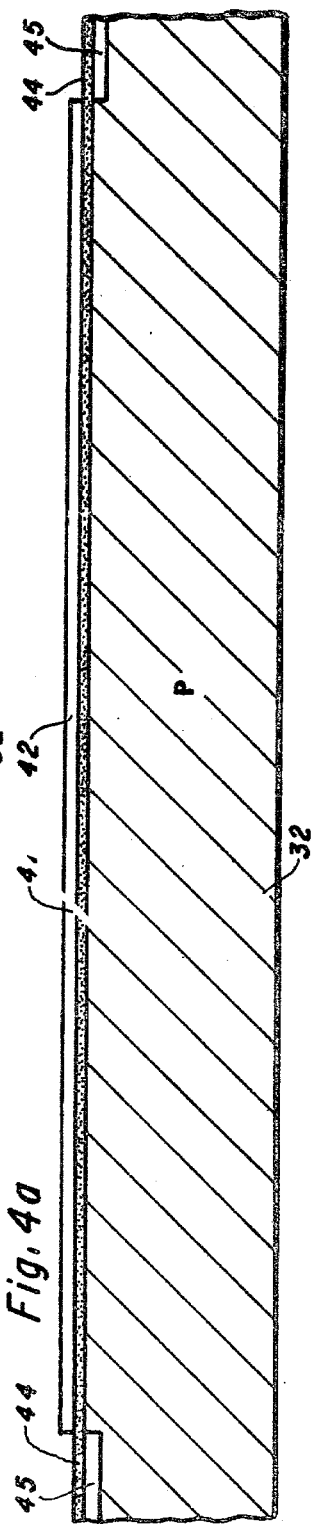

PUNCH-THROUGH LOAD DEVICES IN HIGH DENSITY STATIC MEMORY CELL

BACKGROUND OF THE INVENTION

This invention is directed to semiconductor devices and more particularly to improved static memory cells of the type formed in MOS integrated circuit form.

Static memory devices are preferable over dynamic devices in some types of digital equipment because the refresh overhead inherent in dynamic memories is unnecessary. This is particularly true in microcomputers using relatively small memory arrays where the refresh circuitry would be larger in proportion to the memory circuitry. Static cells traditionally employed six transistor bistable circuits wherein depletion-mode MOS transistors were used as load devices. These cells were much larger in cell area than one transistor cells of dynamic memories, so the density in cells per chip was rather low. Thus, the cost of static memory has been much higher than dynamic. In efforts to reduce the cell size and thus increase cell density on a chip, various improvements have been made in cell layout and manufacturing processes. The design rules or minimum line widths and tolerances have been reduced, and also cell structures which reduce the number of contacts per cell and increase the efficiency in the use of various crossovers and the like have been attempted. One of the major improvements has been the use of implanted polycrystalline silicon resistors as the load devices in the conventional bistable circuit as disclosed in U.S. application Ser. No. 727,116 issued to Rao et al now U.S. Pat. No. 4,110,776 and copending applications Ser. No. 801,699, filed May 31, 1977, by Raymond & Lien, and Ser. No. 910,248, filed May 30, 1978 by McElroy, all assigned to Texas Instruments. Other static memory cell designs which provide higher density and lower power dissipation are shown in pending applications Ser. Nos. 925,891, 925,892, now U.S. Pat. No. 4,198,695, 925,893 and 925,916, now U.S. Pat. No. 4,184,208 all filed July 19, 1978 by Caudel, McElroy, Ponder and Tubbs, respectively, all assigned to Texas Instruments. While very notable improvements have been made, a continuing effort to reduce cell size and simplify manufacture is dictated by the demand for higher density and lower cost.

It is a principal object of this invention to provide improved static memory cells for semiconductor memory devices. Another object is to provide cell designs of high density in MOS static memory arrays. An additional object is to provide improved layout techniques for MOS integrated circuits which permit simplified interconnections using less space on a semiconductor chip.

SUMMARY OF THE INVENTION

In accordance with one embodiment of the invention, a semiconductor memory of the static type employs a pair of cross-coupled driver transistors which are formed by a method which results in field oxide over the source and drain regions of the MOS transistors. Access transistors are formed by a different method and have silicon gates self-aligned with their source and drain diffusions. The load devices are punch-through elements resembling short channel transistors without gates. These features permit a cell layout with a minimum of space used for the cross-coupling connections, and the polysilicon address line can cross over the ground line, producing a very small cell size.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a—3e are elevation views in section of the cell of FIG. 1, taken along the lines a—a, b—b, c—c, d—d, and e—e respectively; and FIGS. 4a-4d are elevation views in section of the semiconductor device of FIGS. 1 and 3, at successive states in the manufacturing process, taken along the line d—d in FIG. 1.

DETAILED DESCRIPTION OF SPECIFIC EMBODIMENT

Figure 1:
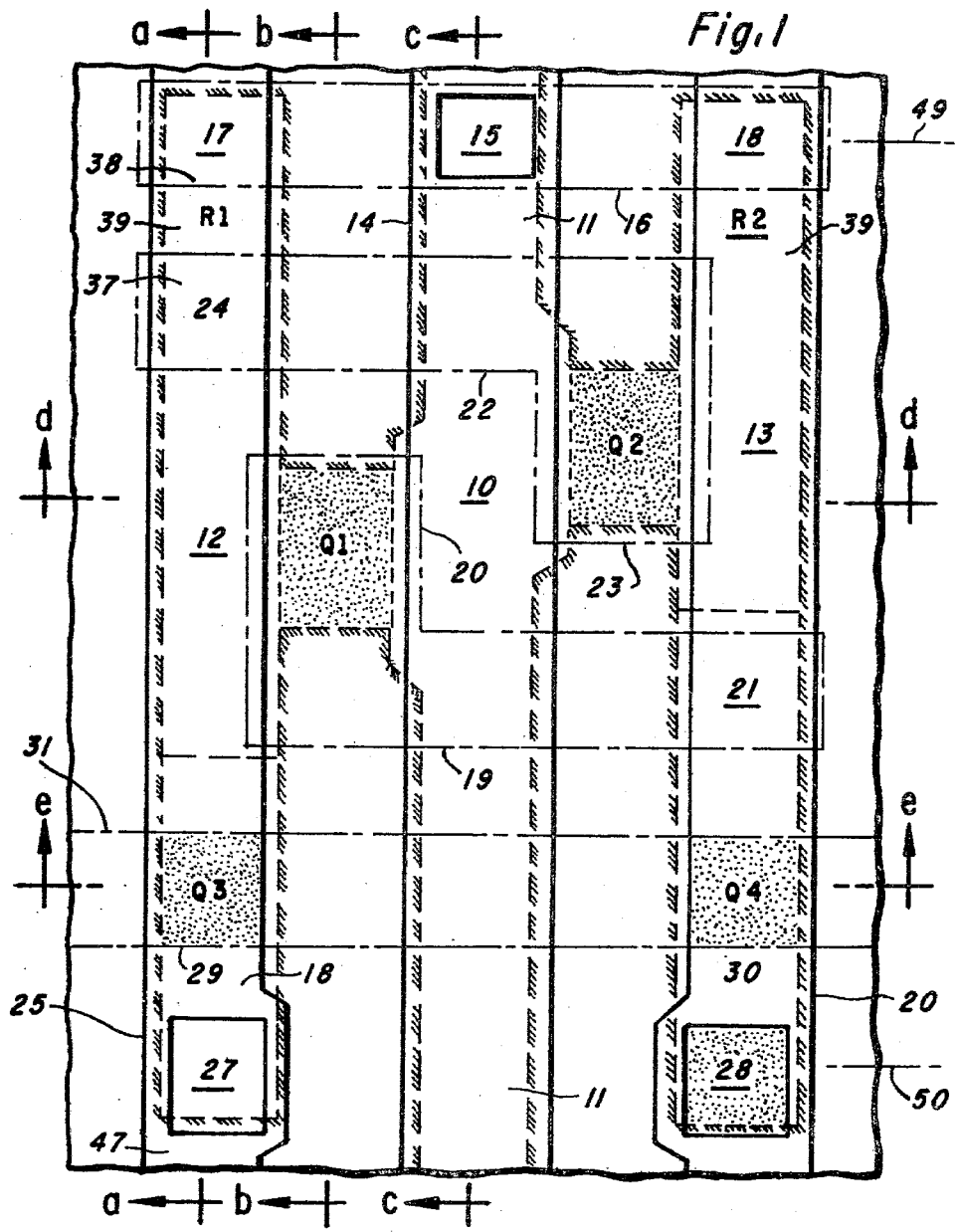
FIG. 1 is a greatly enlarged plan view of a small portion of a semiconductor chip showing the physical layout of a static RAM cell having the features of the invention.

Referring to FIG. 1, a physical layout is shown of an N-channel silicon gate MOS static RAM cell which utilizes the features of the invention. This cell is of course greatly enlarged in FIG. 1, as it would actually occupy less than about one square mil, i.e., the larger dimension of the cell of FIG. 1 would not be more than about one mil. The cell is also shown in FIG. 2 as an electrical schematic diagram, with the parts numbered the same as FIG. 1.

Figure 2:
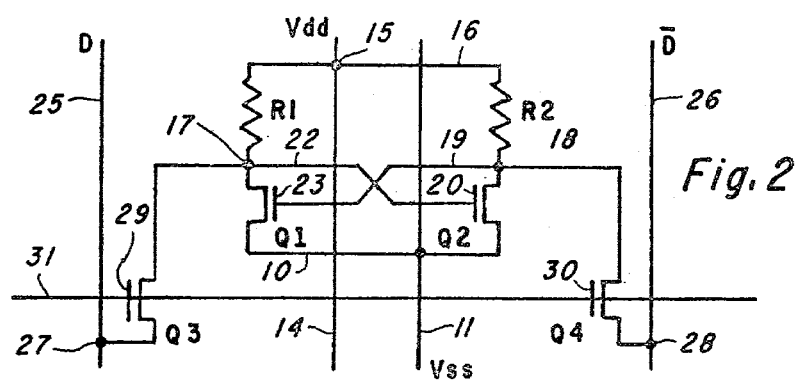
FIG. 2 is an electrical schematic diagram of the cell of FIG. 1.

The cell in FIGS. 1 and 2 consists of a pair of cross-coupled driver transistors Q1 and Q2 having a common source 10 which is part of an elongated N+ region 11 functioning as a ground or Vss line. The N+ region 11 is buried under thin field oxide. Each of the transistors Q1 and Q2 has an N+ drain region 12 or 13, respectively, forming the storage nodes which are electrically connected to Vdd or positive supply line 14 through resistors R1 or R2. According to a feature of one embodiment, the resistors R1 and R2 are formed by punch-through MOS devices. The Vdd supply line 14 is an elongated metal strip running above and parallel to the Vss line 11. A metal-to-poly contact area 15 and a polysilicon strip 16 connect the Vss line 14 to poly-to-moat contacts 17 and 18 which are electrodes of the punchthrough diodes. The other electrodes of the diodes are formed by the N+ drains 12 and 13. A polysilicon conductor 19 connects the poly gate 20 of the transistor Q1 to the drain 13 at a contact area 21. Likewise, a polysilicon strip 22 forms the gate 23 of the transistor Q2 and connects to the drain 12 at a poly-to-moat contact 24, providing the cross-coupling connection of a bistable or flip-flop circuit. Metal strips 25 and 26 provide data and data bar lines (usually referred to D and $\overline{D}$, or as D0 and D1) and these are connected to the drains 12 and 13 via coupling transistors Q3 and Q4 and metal-to-moat contacts 27 and 28. The gates 29 and 30 of the transistors Q3 and Q4 are part of a word address line 31 which polysilicon strip.

Referring to FIGS. 3a–3e, sectional views of the cell of FIG. 1 show details of construction. The cell is a small part of a substrate 32 of P-type silicon. The transistors Q1, Q2, Q3 and Q4 are formed in elongated moat regions in which N+ diffused regions 10, 11, 12, 13, etc., create the source and drain regions for the transistors. The transistors Q1 and Q2 are formed by a process wherein the N+ regions are under a thin field oxide layer 33, whereas the transistors Q3 and Q4 are formed by a self-aligned process and are surrounded by thick field oxide 34, as will be explained. Also, N+ regions in the moats form the lower parts of the metal-to-moat or poly-to-moat contacts 17, 18, 21, 24, 27 and 28. A thin silicon oxide gate dielectric layer 35 and phosphorous-doped polysilicon areas 16, 19, 20, 22, 23, 29, 30 and 31 form the gates of the transistors, the interconnections, and the address line. Thick field oxide 34 exists at all areas where moats including N+ diffused regions or transistors do not exist, and a P+ boron-doped channel-stop region is created under all areas of the thick field oxide 34. An insulating layer 36 is formed over the entire top surface, overlying the polysilicon, the field oxide 34, and the N+ regions. The lines 14, 25 and 26 are metal strips overlying this insulating layer 36.

As seen in FIG. 1 and FIG. 3b, the resistors R1 and R2, according to a feature of one embodiment, each consist of N+ source and drain type regions 37 and 38 separated by a channel type region 39, similar to an MOS transistor with a short channel and no gate. Due to the small size of these punch-through resistors R1 and R2, and the simpler cross-over connections made possible by the process with diffusion under thin field oxide, the cell of FIGS. 1-3 is potentially much smaller in size compared to prior static cells using implanted resistors in first level or second level polysilicon as disclosed in applications Ser. No. 727,116 and Ser. No. 801,699.

It is important to note that the polysilicon (or its underlying thin oxide) does not function as a diffusion mask to form the transistors Q1 and Q2; however, the polysilicon strip 31 and gates 29 and 30 define the extent of the N+ diffusion, by means of the thin gate oxide which is the diffusion mask, to form the source and drain of the transistors Q3 and Q4. The poly segments 19, 20, 22 and 23 can cross over moats without creating transistors. In double-level poly processes such as shown in applications Ser. No. 648,594, filed Jan. 12, 1976 by C-K Kuo, or Ser. No. 754,144 now U.S. Pat. No. 4,112,509 filed Dec. 27, 1976 by L. S. Wall, the second-level poly is used to define the boundaries of the N+ diffusion, so that neither first nor second level poly interconnections can cross over an N+ diffused moat. In other static cell manufacturing methods double-level poly processes such as shown in Ser. No. 801,699 or Ser. No. 910,248, are used so one of the levels of polysilicon can cross moats or diffused regions. In the device shown here there is no such constraint; the first and only level of polysilicon can cross over an N+ moat without forming a transistor.

Figure 4B:
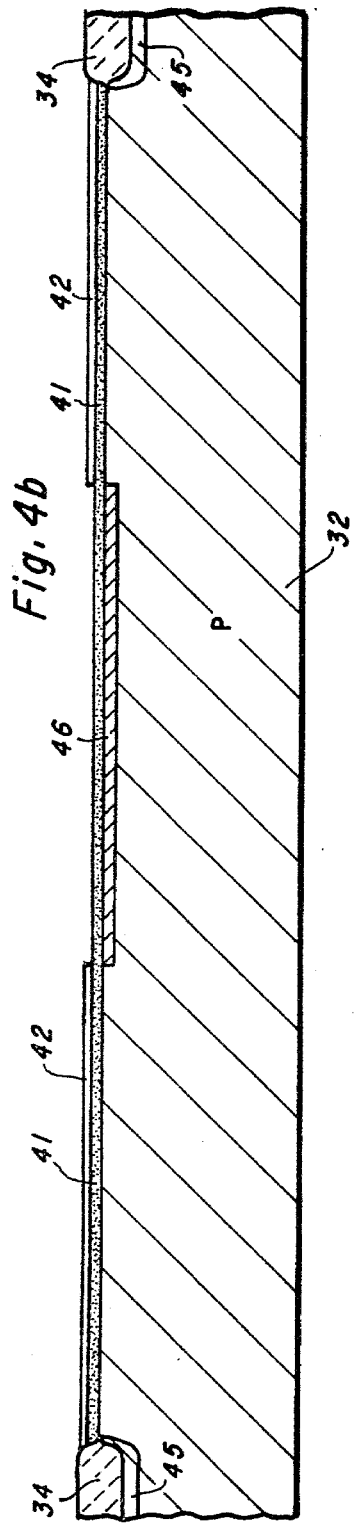

Referring now to FIGS. 4a-4d, a process for making the N-channel, silicon-gate, self-aligned, single-level poly, MOS integrated circuit device of FIGS. 1 and 3-3d will be described. The starting material is a slice of P-type monocrystalline silicon, perhaps three of four inches in diameter and 20 mils thick, cut on the —100— plane, of semiconductor grade with a resistivity of about five to twenty ohm-cm. In FIGS. 3a or 4a, a wafer or body 32 represents a very small part of the slice of about one mil in lateral dimension, chosen as a representative sample cross section. Typically, a slice would contain hundreds of bars or chips and each chip would contain perhaps 16K or 64K cells. First, after appropriate cleaning, the slice is oxidized by exposing to oxygen in a furnace at an elevated temperature of about 1000 Degrees C or above to produce an oxide layer 41 of a thickness of about 1000 Angstroms. Next a layer 42 of silicon nitride $Si_3N_4$ about 1000 Angstroms thick is formed by exposing to an atmosphere of dichlorosilane and ammonia in a CVD reactor. A coating of photoresist is applied to the entire top surface, then exposed to ultraviolet light through a mask which defines the desired pattern, and developed, leaving areas where nitride is to be etched away and thick field oxide 34 is to be grown. Alternatively, smaller geometries and thus smaller cell sizes may be obtained by using X-ray or electron beam lithography in place of UV light and glass masks to expose the photoresist; X-ray lithography is described in Electronics, Nov. 9, 1978, p. 99 and electron beam lithography is disclosed in Bell Laboratories Record, March 1976, p. 69–72 and Electronic Products, February 1977, p. 17. The slice is next subjected to a plasma etch, which removes the areas 44 of the nitride layer 42 not covered by the exposed photoresist, but does not remove the oxide layer 41 and does not react with the photoresist.

The slice is next subjected to an ion implant step, whereby boron atoms are implanted in the areas 44 of silicon not covered by photoresist and nitride 42. The photoresist is left in place as an implant mask. Boron is an impurity which produces P-type conductivity, so more heavily doped P+ regions 45 will be produced in the surface. The oxide layer 41 is left in place during the implant because it prevents the implanted boron atoms from out-diffusing from the surface during subsequent heat treatment. The boron implant is at a dosage of about $4 \times 10^{12}/cm^2$ at 100 KeV. After the implant, the photoresist layer is removed.

As will be seen, the regions 45 do not exist in the same form in the finished device, because some of this part of the slice will have been consumed in the oxidation procedure. The implanted regions 45 will ultimately produce the P+ channel stop regions.

As set forth in U.S. Pat. No. 4,055,444, issued Oct. 25, 1977 to G. R. Mohan Rao, assigned to Texas Instruments, the next step in the process is to subject the slice to a heat treatment or annealing step, during which the slice is maintained at a temperature of about 1000 degrees C for about 2 hours in an inert atmosphere, preferably nirogen. This step causes the boron concentration to change markedly, which has desirable effects aside from reduction in bulk damage in the crystal structure. The P+ regions 45 penetrate deeper into the silicon surface during this anneal step.

The following step is formation of the initial layer of the thick field oxide 34, which is done by subjecting the slices to steam or an oxidizing atmosphere at about 950 Degrees C or above for several hours. As seen in FIG. 4b, this causes part of the thick field oxide layer 34 to be grown, and this layer extends into the silicon surface because silicon is consumed as it oxidizes. The nitride layer 42 masks oxidation beneath it. The thickness of this layer 34 is about 5000 Angstroms at this point, half of which is above the original surface and half below. The boron doped P+ region 45 as previously implanted and modified by the anneal step will be partly consumed, but will also diffuse futher into the silicon ahead of the oxidation front. The channel stop P+ regions which result which will be deeper and of more uniform and acceptable concentration at the surface compared to what would have resulted without the anneal step.

Also, the channel stop regions will not have the extent of crystalline structure damage characteristic of implanted devices.

The slice is now coated with another photoresist layer and then exposed to ultraviolet light through a mask which defines the source and drain areas 12 and 13 as well as the Vss lines 11 which are to be N+ diffused. After developing the photoresist the slice is again subjected to a nitride etchant which removes the parts of the nitride layer 42 now exposed by holes in the photoresist. The parts of the oxide layer 41 exposed when this nitride is removed are then etched to expose bare silicon. An arsenic ion implant produces the N+ regions 46 which will subsequently become the sources, drains, and Vss line.

Preferably, the process employing arsenic implant set forth in copending application Ser. No. 897,318, filed Apr. 18, 1978 by Bartlett, Jordan and Mundt, assigned to Texas Instruments, is used to form these N+ regions, as the resulting enhanced oxide growth will aid in precise definition of the channel.

Figure 4C:
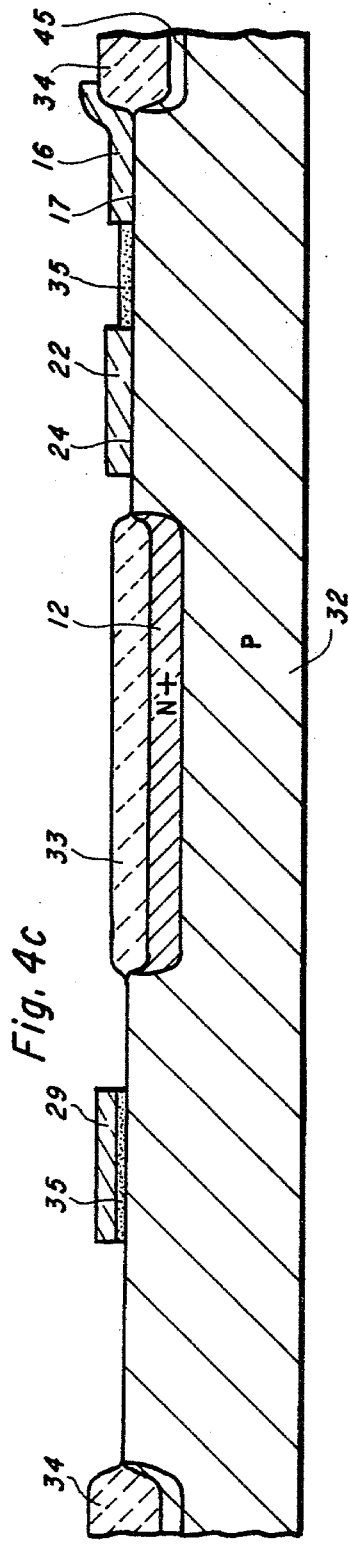

Referring to FIG. 4c, a second field oxidation step is now performed by placing the slice in steam or dry oxygen at about 1000 Degrees C for several hours. This oxidizes all of the top of the slice not covered by the remaining parts of the nitride layer 42, producing thin field oxide 33 which is about 5000 Angstroms thickness. During the oxidation, the areas of field oxide 34 grow thicker, to perhaps 10,000 Angstroms. The N+ regions 46 are partly consumed but also diffuse further into the silicon ahead of the oxidation front to create the heavily doped regions 11, 12 and 13.

Next the remaining nitride layer 42 is removed by an etchant which attacks nitride but not silicon oxide, then the oxide 41 is removed by etching and the exposed silicon cleaned. The gate oxide 35 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the cell array or periphery may be adjusted by ion implant. Also, windows in the oxide layer 35 for polysilicon to silicon contacts 17 and 18, and others if needed in the periphery, are patterned and etched at this point using photoresist. Note that the oxide layer 35 is left in place over the channel 39.

Figure 4D:
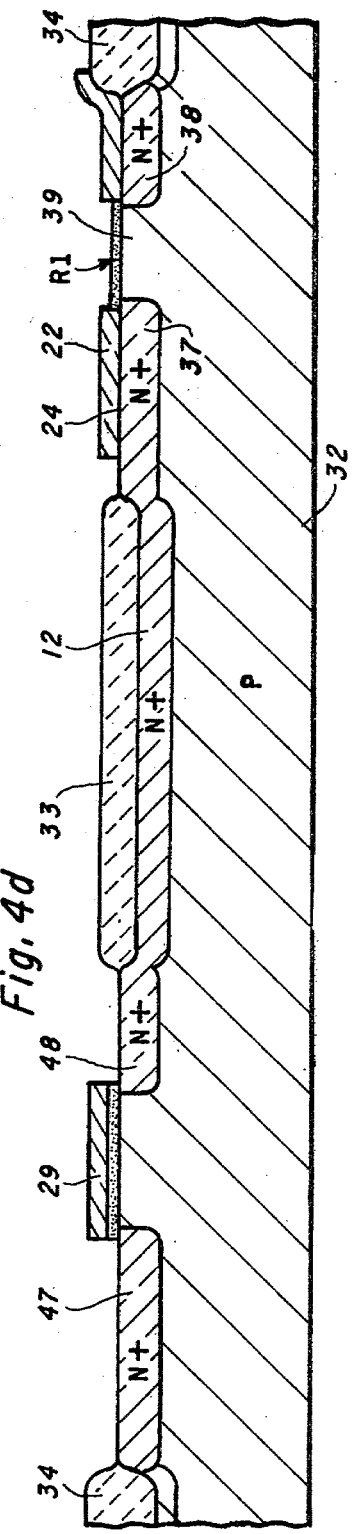

As seen in FIG. 4d a layer of polycrystalline silicon is deposited over the entire slice in a reactor using standard techniques to a thickness of about 5000 Angstroms. This first level polysilicon layer is patterned by applying a layer of photoresist, exposing to ultraviolet light through a mask prepared for this purpose, developing, then etching both photoresist and polysilicon.

Using the remaining polysilicon coating and its underlying thin oxide 35, as well as the field oxide 33 and 34, as an implant mask, the slice is now subjected to another N+ arsenic ion implant. Arsenic is implanted and then driven into the silicon slice 32 to produce the N+ drain regions 38 by penetration through the polysilicon, and the source and drain regions 47 and 48. The depth of diffusion is about 4000 to 5000 Angstroms. In the peripheral circuitry, this implant can create regions which function as conductors to connect various regions together, and also function as the source or drain regions of other transistors. This implant renders highly conductive all of the exposed polysilicon areas such as gates 20 and 23, the strips 19 and 22, the line 31, etc. In the poly-to-moat contact areas 17 and 18 the N+ implant penetrates the poly and converts the underlying P-type silicon to N+ because here the oxide layer 35 has been removed. A thin thermal SiO$_2$ coating 52 is grown and patterned at metal contacts.

As seen in FIG. 3a, fabrication of the device is continued by depositing a thick layer 36 of phosphorus-doped oxide. Rather than by oxidizing, this is done by a low temperature reaction process using conventional chemical vapor deposition techniques. A layer 36 of about 10,000 Angstroms is produced, covering the entire slice. This deposition is followed by a "densification" step wherein the slice is heated at 950 Degrees C for the purpose of eliminating minute holes or pores in the oxide. Subsequently, a photoresist operation opens windows in the oxide layer 36 in areas 15, 27 and 28 where contact is to be made from metal to the polysilicon strip 15 and to the moat areas 37 and 38. Then, a layer of aluminum is deposited on the entire slice, and selectively etched using photoresist masking to produce the desired pattern of metal strips 14, 25 and 26.

In an array of a large number of the cells of FIG. 1, the layout on the chip would make use of considerable economy of space by mirroring the cell about an axis 49 to define the cell above the one shown, so the contacts 17 and 18 are shared with the adjacent cell above this axis. In similar manner the cell is mirrored about an axis 50 to share the contacts 27 and 28 with the cell below the one shown.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A static memory cell of the type formed in a face of a semiconductor body and having:

a pair of driver transistors each having source and drain regions, a channel, and a gate, the source and drain regions being formed by heavily doped regions in the face of the semiconductor body, the gates overlying the channels and separated therefrom by a gate oxide layer;

conductive means separately connecting the drain regions of each of the driver transistors to the gate of the other driver transistor to provide a cross-coupled bistable circuit, the conductive means overlying said layer of field oxide;

a pair of access transistors each having a source to drain path and a gate;

a pair of data lines on said face with means coupling each date line separately through the source to drain path of a different one of the access transistors to the drain region of a different one of the driver transistors; and an address line on said face connected to the gate of both of the access transistors;

the improvement comprising:

a pair of load devices at said face of the body with each load device being a punch-through MOS short channel transistor having one electrode coupled to a voltage supply line on said face and a second electrode coupled separately to a different one of said drain regions on the driver transistors.

2. A memory cell according to claim 1 wherein the semiconductor body is predominantly P-type silicon, the heavily doped regions are N-type, the gates are polycrystalline silicon, and a layer of thick field oxide surrounds said source and drain regions and said channel.

3. A memory cell according to claim 1 wherein said second electrode of each of the short channel transistors is an N+ region contiguous with one of said drain regions.

4. A cell according to claim 3 wherein each of said short channel transistors has a channel between said one electrode and said second electrode, the channel having no polysilicon gate thereon.

5. A cell according to claim 4 wherein the source to drain paths of the access transistors include heavily doped regions in the face of the body self-aligned with the gates of the access transistors, such heavily doped regions not being covered by said layer of thermal field oxide.

6. A cell according to claim 5 wherein said voltage supply line is a conductive metal strip overlying but insulated from an elongated heavily doped region, forming a ground line contiguous with said source regions and wherein said pair of data lines are conductive strips on said face.

7. A cell according to claim 6 wherein said data lines overlie said drain regions and said access transistors.

8. A cell according to claim 7 wherein said pair of data lines separately overlie said pair of load devices.

9. A cell according to claim 8 wherein said heavily doped regions of said access transistors include regions contiguous with said drain regions of the driver transistors.

10. A cell according to claim 9 wherein said load devices include doped regions in said face spaced from said drain regions of the driver transistors, and a polysilicon strip connects such doped regions to said voltage supply line.

* * * * *